United States Patent [19]

Plumton et al.

[11] Patent Number: 4,868,633
[45] Date of Patent: Sep. 19, 1989

[54] SELECTIVE EPITAXY DEVICES AND METHOD

[75] Inventors: Donald L. Plumton; Liem T. Tran, both of Dallas; Hung-Dah Shih, Plano, all of Tex.

[73] Assignee: Texas Instruments Incorporated, Dallas, Tex.

[21] Appl. No.: 921,913

[22] Filed: Oct. 22, 1986

[51] Int. Cl.$^4$ .................... H01L 23/54; H01L 23/48
[52] U.S. Cl. ........................... 357/67; 357/71; 357/34
[58] Field of Search ........... 357/16, 67, 34, 71, 357/30 D, 30 E, 63; 148/102, 105, 10, 84, 35, 72, 103; 437/155, 31, 36, 80, 126, 129, 132, 133, 150, 155, 160, 167, 168; D16/72, 101, 102, 105, 103, 106

[56] References Cited

U.S. PATENT DOCUMENTS

| | | | |
|---|---|---|---|
| 3,909,319 | 9/1975 | Fujiwara et al. | 437/155 |
| 4,586,968 | 5/1986 | Coelio-Verg | 148/DIG. 106 |
| 4,617,724 | 7/1986 | Yokoyama et al. | 437/133 |
| 4,628,588 | 12/1986 | McDavid | 437/55 |
| 4,679,305 | 7/1987 | Morizuka | 357/16 |
| 4,735,913 | 4/1988 | Hayes | 148/DIG. 105 |

FOREIGN PATENT DOCUMENTS 0022157 2/1979 Japan ..................... 437/155

OTHER PUBLICATIONS

IBM Tech Disclosure vol. 13, No. 2, Jul. 1970, p. 318, Mohr., "Selective Metal Masking in Semiconductor Device Preparation".

*Primary Examiner*—William L. Sikes
*Assistant Examiner*—S. V. Clark
*Attorney, Agent, or Firm*—Rerdinand M. Ramano; Carlton H. Hoel; Melvin Sharp

[57] ABSTRACT

Selective growth of GaAs and related semiconductors (34) by use of tungsten silicide and related materials for growth masks (36) plus devices incorporating the selective growth plus use of the growth masks as electrical contacts are disclosed. The deposition of semiconductor (38) on such masks (36) is inhibited and single crystal vertical structures (34) grow on unmasked regions of the lattice-matched substrate (32). Variation of the mask (36) composition can vary the inhibited deposition on the mask (36) from small, isolated islands of polycrystalline semiconductor (38) to a uniform layer of polycrystalline semiconductor abutting the single crystal structures. Preferred embodiments include bipolar transistors with the selectively grown structure forming the base and emitter or collector and the mask being the base contact and also include lasers with the vertical structures including the resonant cavities with the mirrors being the sidewalls of the vertical structures.

21 Claims, 9 Drawing Sheets

SELECTIVE EPITAXY DEVICES AND METHOD

BACKGROUND OF THE INVENTION

1. Field of the Invention.

The present invention relates to semiconductor devices and methods of fabrication, and, more particularly, to selective epitaxy of semi-conductor materials such as gallium arsenide and the resultant devices such as heterojunction bipolar transistors and lasers.

2. Description of the Related Art.

Gallium arsenide (GaAs) has emerged as a leading semiconductor material for high speed integrated circuits because of its high electron mobility and its availability in semi-insulating form. Further, the possibilty of epitaxial growth of $Al_xGa_{1-x}As$ on GaAs and vice versa allows fabrication of structures such as heterojunction bipolar transistors, high electron mobility transistors (HEMTs), quantum well lasers, and superlattices. Epitaxial growth of GaAs (and other III-V and II-VI compounds) can be performed by liquid phase epitaxy, molecular beam epitaxy (MBE), and metalorganic chemical vapor deposition (MOCVD). MBE and MOCVD both provide the ability to grow extemely abrupt p-n junctions and heterojunctions of lattice-matched materials; and such abrupt junctions are required for fabrication of superlattices and quantum well structures.

One of the disadvantages of MBE and MOCVD is the inability to deposit epitaxial material selectively on a substrate rather than as a uniform sheet covering the substrate. Several masks to achieve selective deposition of GaAs on GaAs and $Al_xGa_{1-x}As$ have been proposed: T. Lee et al, 29 Appl. Phys. Lett. 164 (1976), used silicon dioxide; S. Hiyamigu et al, 127 J. Electrochemical Soc. 1562 (1980), tried $GaAsO_x$; P. Favenner et al, 18 Elec.Lett. 933 (1982), formed the mask by lattice-damaging ion implantation; and J. Harbison et al, B3 J.Vac.Sci.Tech. 743 (1985), invoked tungsten. However, these masks are either insulators or unable to dope the substrate or both. Further, polycrystalline GaAs forms on the masks abutting the epitaxial GaAs growing from the exposed substrate, and this polycrystalline GaAs is difficult to remove and can also act as a short circuit path.

The use of selective growth masks is related to the problem of the base contact in heterojunction bipolar transistors. In particular, for an emitter-up configuration control of the base doping and width is not easily reconcilable with the collector contact: if a base layer is non-selectively grown by MBE, then contact to the base may be by etching down to the base layer (see Rezazadeh et al, B4 J.Vac.Sci.Tech. 773 (1986)) or by implanting a doped region down to the base layer, but the collector contact must be etched down through the base layer; if a base is formed by localized ion implant (so collector contact is simple), then control of base width and doping becomes a problem, and base contact again may be by etching down (see J. Tully, 7 IEEE Elec. Dev. Lett. 203 (1986)) or implanting a doped region down to the base (see J. Yuan et al, 16 Elec.Lett. 637 (1980)). and W. McLevige et al 3 IEEE Elec.Dev.-Lett. 43 (1982)).

Similarly for an emitter-down (common emitter) configuration device isolation may be by a lattice-damaging implant to fragment a nonselectively grown base layer or by a mesa etch through the base layer. In either case recombination problems are associated with the damaged interface. Further, photolithographic limitations arise for the alignment of doped regions contacting the base and the collector; and self-aligned methods rely on complex lift-off schemes which have inherent reproducibility problems (see Ohshima et al, 1985 IEEE GaAs IC Symp. p. 53and Change et al, 7 IEEE Elec.Dev.-Lett. 8-10 (1986)).

A problem with heterojunction laser fabrication is the formation of the cavity mirrors. Several methods have been tried, including wet chemical etching by M. Wada et al, 21 IEEE J. Quant. Elec. 658 (9185), reactive ion etching by L. Coldren et al, 37 Appl. Phys. Lett. 681 (1980), and microcleaving by H. Nobuhara et al, 21 Elec. Lett. 718 (1985). These methods have in common the removal of of material and the associated surface damage or yield problems. Microcleaving usually gives the best results because of the smooth vertical nature of the cleaved facets; however, microcleaving does not lead to high yield laser/transistor integration on a single chip.

Thus the problems of GaAs and related semiconductor fabrication and devices include the lack of growth-selective masks, lack of conducting plus dopant source growth masks, and lack of devices with selectively grown semiconductor regions.

SUMMARY OF THE INVENTION

The invention provides selective growth of GaAs and related semiconductors on a lattice-matched substrate by use of tungsten silicide and related materials for growth masks; the invention also provides devices incorporating the selective growth structures plus the ability to use the masks as electrical contacts. The deposition of semiconductor on such masks is inhibited and single crystal vertical structures grow on unmasked regions of the lattice-matched substrate. Variation of the mask composition, the mask cleanup procedure and the MBE growth temperature can vary the inhibited deposition on the mask from small, isolated islands of polycrystalline semiconductor to a uniform layer of polycrystalline semiconductor abutting the single crystal structures. Preferred embodiments include bipolar transistors with the selectively grown structure forming the base and/or emitter and/or collector and the mask defining or being the base contact and also include lasers with the vertical structures grown as heterostructures to form the resonant cavities with the cavity mirrors being the sidewalls of the vertical structures.

BRIEF DESCRIPTION OF THE DRAWINGS

The drawings are schematic for clarity.

DESCRIPTION OF THE PREFERRED EMBODIMENTS

Figure 1A:
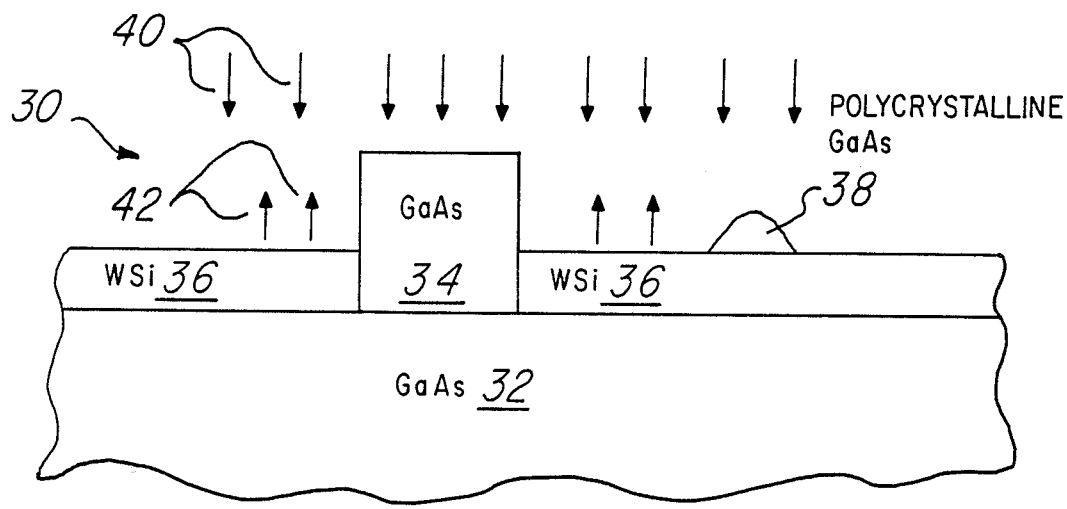
FIGS. 1A-B are cross sectional elevation and plan views of selective epitaxial growth.
Figure 1B:
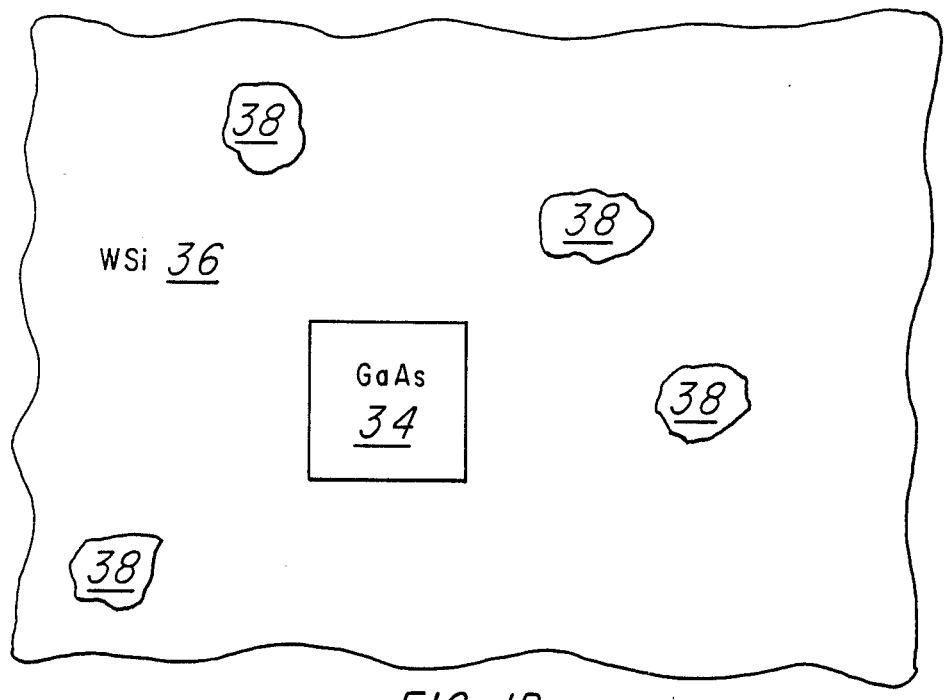

Prior to description of preferred embodiments of the invention, we first consider a simplified example of selective epitaxial growth of GaAs on a GaAs substrate. FIGS. 1A-B illustrate in cross sectional elevation and plan views the selective growth by MBE of GaAs pedestal 34 through the opening in tungsten silicide ($W_xSi_{1-x}$ with $x \approx 0.6$) mask 36 on GaAs substrate 32. Arrows 40 indicate the incoming flux of Ga atoms and $As_2$ dimers; and arrows 42 indicate the evaporation of Ga and As from mask 36. Pedestal 34 grows epitaxially from substrate 32 by the usual MBE mechanism of the impinging Ga atoms migrating on the pedestal top surface to appropriate lattice sites and epitaxially depositing in the presence of excess As. The growth temperature is typically about 600° C. for GaAs. The sticking coefficient of the As on the surface is close to one, so the Ga flux determines the growth rate. Note that the migration of Ga atoms from the top surface to the sidewalls of pedestal 34 is inhibited by the higher energy of the lattice sites at the edges of the top surface.

Figure 2:
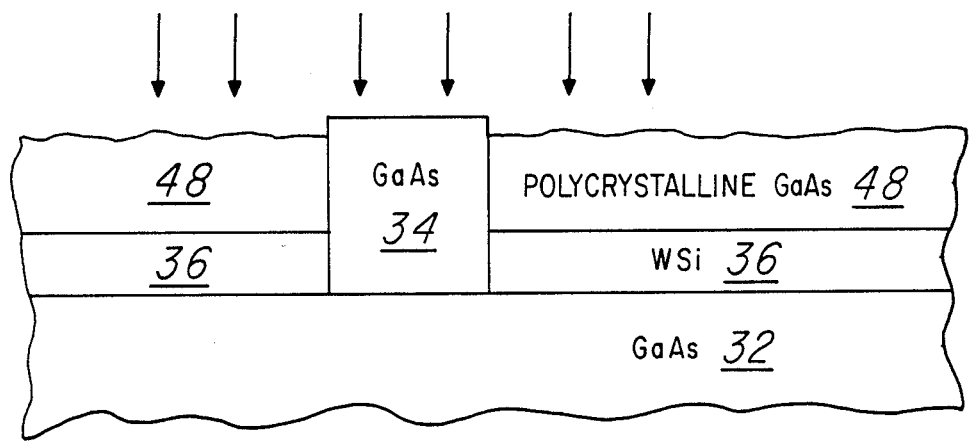
FIG. 2 is a cross sectional elevation view of selective epitaxial growth with adjacent non-epitaxial deposition.

In contrast, the Ga and $As_2$ impinging on mask 36 does not stick and evaporates prior to chemical binding, although occasionally some GaAs does nucleate on mask 36 and begin to grow polycrystalline GaAs islands 38. The likelihood of polycrystalline GaAs island 38 formation depends upon the surface characteristics of mask 36. If mask 36 is deposited on substrate 32 by sputtering tungsten and silicon targets alternately to form approximately 9 Å thick layers of W and Si to a total height of about 0.2 μm, then the last layer deposited determines whether the surface is W rich or Si rich. For a W rich surface the formation of islands 38 is very unlikely, and typically islands 38 will be separated by tens of μms for growth of a pedestal to a height of 1 μm. Contrarily, for a Si rich surface the formation of polycrystalline GaAs on mask 36 is not inhibited, and the resultant polycrystalline GaAs 48 surrounds single crystal pedestal 34 and is of about the same height; see FIG. 2 for a cross sectional view. The particular MBE growth temperature and flux used play a part in determining the island density. Further, the Si rich surface apparently more readily nucleates GaAs islands because the Si in the film traps carbon which can promote island and/or whisker growth.

Figure 3A:
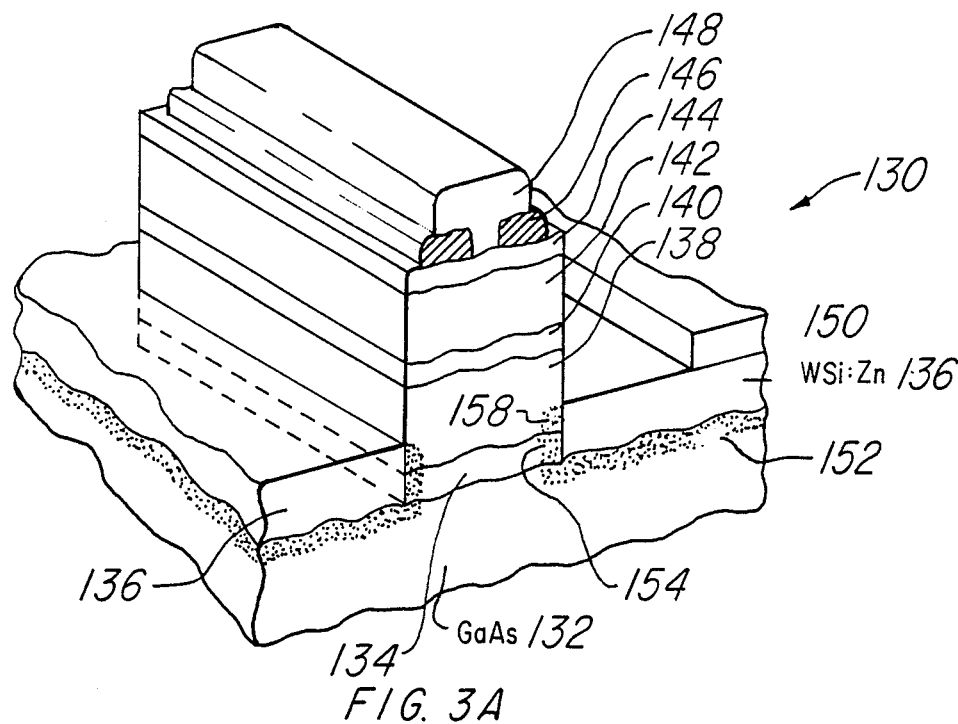
FIGS. 3A-B are cutaway perspective and cross sectional elevation views of a preferred embodiment laser.
Figure 3B:
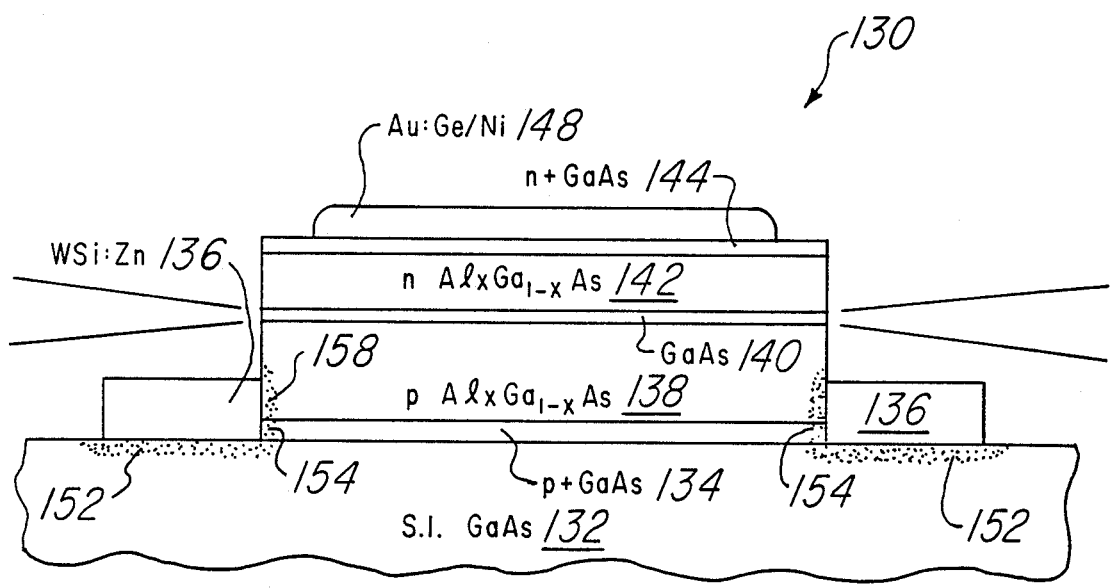

First preferred embodiment heterojunction laser 130 is shown in cutaway perspective and cross sectional elevation views in FIGS. 3A-B and includes semi-insulating GaAs substrate 132, $W_5Si_3$:Zn mask 136, p+ GaAs epilayer 134 in an opening in mask 136, p $Al_xGa_{1-x}As$ epilayer 138 on epilayer 134, undoped GaAs epilayer 140 on epilayer 138, n $Al_xGa_{1-x}As$ epilayer 142 on epilayer 140, n+ GaAs epilayer 144 on epilayer 142, silicon nitride insulator 146, Au:Ge/Ni ohmic contact 148 making contact to epilayer 144, Au ohmic contact 150 making contact to the mask 136, and zinc doped regions 152, 154, and 158 of layers 132, 134, and 138, respectively, abutting mask 136 (the doping is indicated by the speckling in FIGS. 3A-B). Epilayers 134, 138, 140, 142, and 144 are grown by selective epitaxy through a 15 μm by 100 μm rectangular opening in mask 136 as described in connection with FIGS. 1A-B.

Laser 130 is a double heterostructure laser with GaAs epilayer 140, which is 0.2 μm thick, as the resonant cavity. The current (nominally positive) enters through ohmic contact 150, and traverses in turn mask 136, epilayer 138 (or possibly also through epilayer 134 first), cavity 140, epilayer 142, and epilayer 144, and exits ohmic contact 148; and the stimulated emission is by recombination of electrons (injected from epilayer 142) and holes (injected from epilayer 138) in cavity 140. The zinc doped regions 152, 154, and 158 provide for good ohmic contact between mask 136 and semiconductor 132, 134, and 138, respectively. The vertical pedestal growth of epilayers 134, 138, 140, 142, and 144 provides smooth sidewalls with the short ends of the rectangular cavity 140 acting as the cavity mirrors. The pedestal geometry automatically yields a stripe geometry laser, but silicon nitride 144 further confines the current to a narrow stripe about the lengthwise central axis of cavity 140.

Figure 4A:
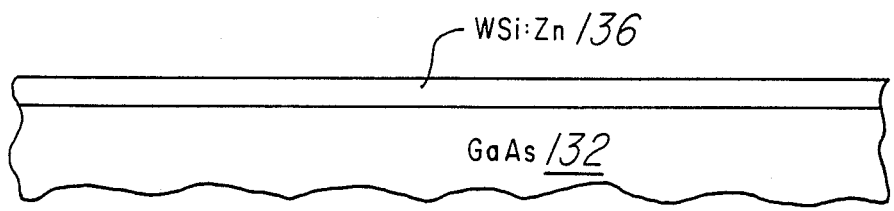
FIGS. 4A-C are cross sectional elevation views of steps in a preferred embodiment method of fabrication.
Figure 4B:
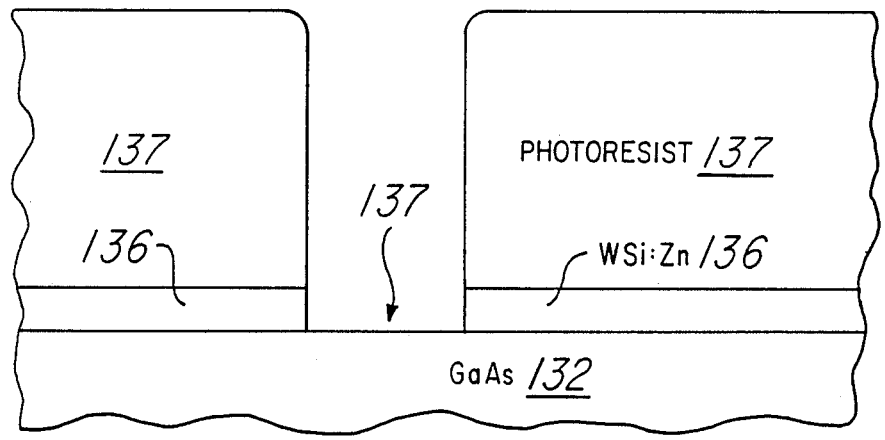
Figure 4C:
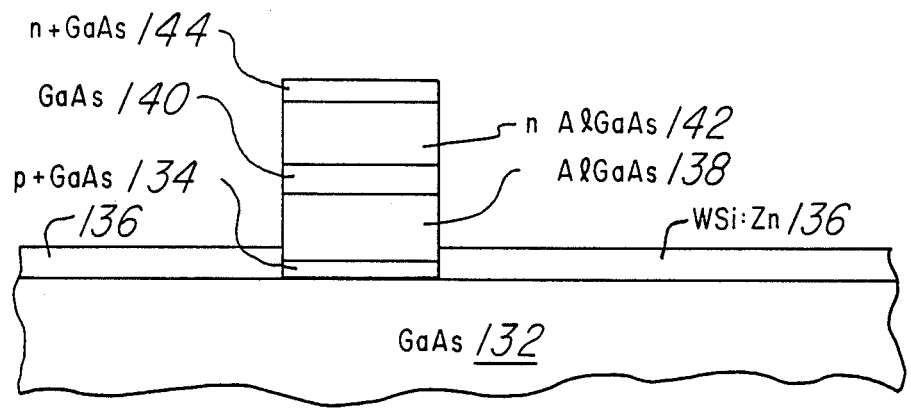

Further understanding of the features and operation of laser 130 comes from consideration of the first preferred embodiment method of fabrication which is illustrated in FIGS. 4A-C and includes the following steps:

(a) Begin with a (100) oriented, undoped semi-insulating GaAs substrate 132 and deposit $W_5Si_3$ doped with 10% zinc layer 136 to a thickness of 0.2 μm. The deposition is by sputtering sequential tungsten, silicon, and zinc targets to produce a stack of sublayers with each sublayer of thickness about 9 Å and formed of monolayers or fractions of monolayers of W, Si, and Zn atoms. Thus there are roughly 200 sublayers forming layer 136. The deposited W and Si react to form the silicide, although stoichiometry is not necessary and layer 136 may be $W_xSi_yZn_{1-x-y}$ with $0.005 \leq x+y \leq 0.5$ and $0.1 \leq x/y \leq 20$. Layer 136 is formed with its top surface W rich by making the last sputtering from the tungsten target. See FIG. 4A for a cross sectional elevation view in which the $W_xSi_yZn_{1-x-y}$ is denoted simply as WSi:Zn as it is below.

(b) Spin photoresist 137 onto layer 136 and photolithographically pattern it to form an etch mask with a rectangular opening of size 15 μm by 100 μm. This etch mask is used to plasma etch opening 137 in layer 136 with a $CF_4$ plus $O_2$ plasma. If other devices are also being fabricated on substrate, then other portions of layer 136 may also be etched away. Other fluorine-based plasmas could also be used; and with low pressure the etching is anisotropic. See FIG. 4B.

(c) Remove photoresist 137, clean, and insert substrate 132 with etched layer 136 into an MBE machine. Raise the substrate temperature to about 650° C., then lower it to 600° C. and grow epitaxial layers as follows: 0.1 μm of p+ GaAs 134 doped with beryllium, 0.4 μm of p $Al_{0.5}Ga_{0.5}As$ 138 doped with beryllium, 0.2 μm of undoped GaAs 140, 0.4 μm of n $Al_{0.5}Ga_{0.5}As$ 142 doped with silicon, and 0.1 μm of n+ GaAs 144 doped with silicon. At this growth temperature the zinc in layer 136 is fairly stable and little diffusion into the semiconductors occurs. Note that the WSi:Zn film composition can be adjusted so that Zn does diffuse out at temperatures as low as 600° C. See FIG. 4C which illustrates the growth of the semiconductors is inhibited on the W rich top surface of WSi:Zn layer 136. Further, the epilayers grow in the form of a pedestal with vertical sidewalls without overhang.

(d) Remove the layered substrate from the MBE and anneal it at 800° C. for ten seconds to drive zinc out of WSi:Zn 136 to form p+ doped regions 152, 154, and 156. These doped regions insure good ohmic contact between WSi:Zn 136 and the abutting semiconductor. Additionally, a high temperature anneal can remove damage in the GaAs caused by the WSi:Zn deposition. Deposit a 0.2 μm thick layer of silicon nitride by LPCVD and photolithographically pattern and etch it to form silicon nitride 146. Lastly, Au:Ge/Ni 146 and Au 150 ohmic contacts are formed by standard liftoff processes. This completes laser 130 except for passivation, lead bonding, and packaging; see FIG. 3A. The composition of the WSi:Zn film can be varied to control the temperture at which zinc readily diffuses out; in particular, with high zinc concentrations (upwards of 50% zinc) temperatures as low as 500° C. diffuse substantial zinc in ten seconds, for 10% zinc temperatures of 700° C. apply, and for low zinc concentrations (1%) 850° C. is appropriate. Of course, the amount and depth of the zinc diffusion depends upon the duration of the applied high temperature, and the 1-2 hours at 600° C. typical to grow the pedestal may diffuse sufficient zinc from a 1% Zn layer of WSi:Zn.

Other devices (such as bipolar transistors, MESFETs, and photodiodes) could also be fabricated on substrate 132 and optical fibers connected to provide optical input and output. Also, p+ GaAs epilayer 134 could be deposited on substrate 132 prior to the formation of WSi:Zn 136; this would insure a good ohmic contact between the WSi:Zn and the abutting semiconductors but would require more involved device isolation. Further, if the need arises for a ohmic contact better than the WSi:Zn, the the p+ Zn diffused region in the GaAs formed by Zn from the WSi:Zn permits good AuZn ohmics to be fabricated.

Figure 5A:
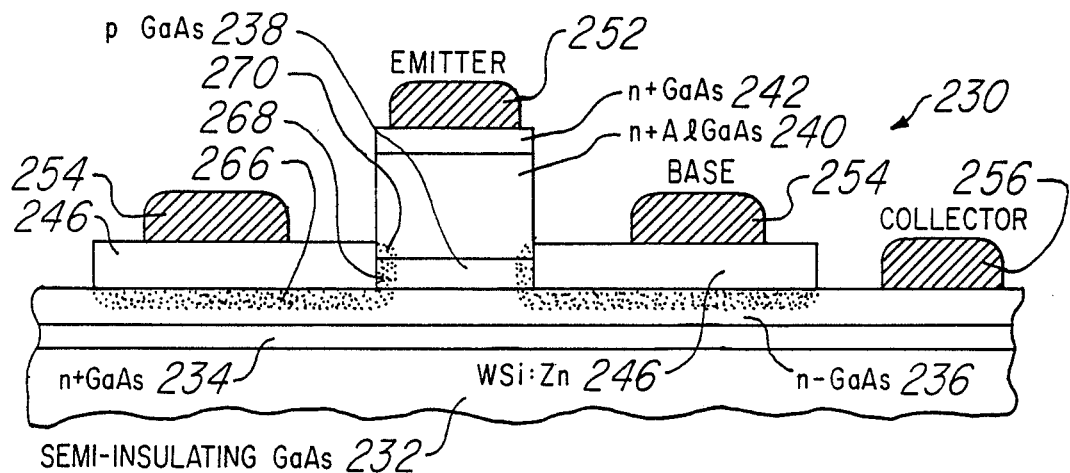
FIGS. 5A-B are cross sectional elevation and plan views of a preferred embodiment bipolar transistor.
Figure 5B:
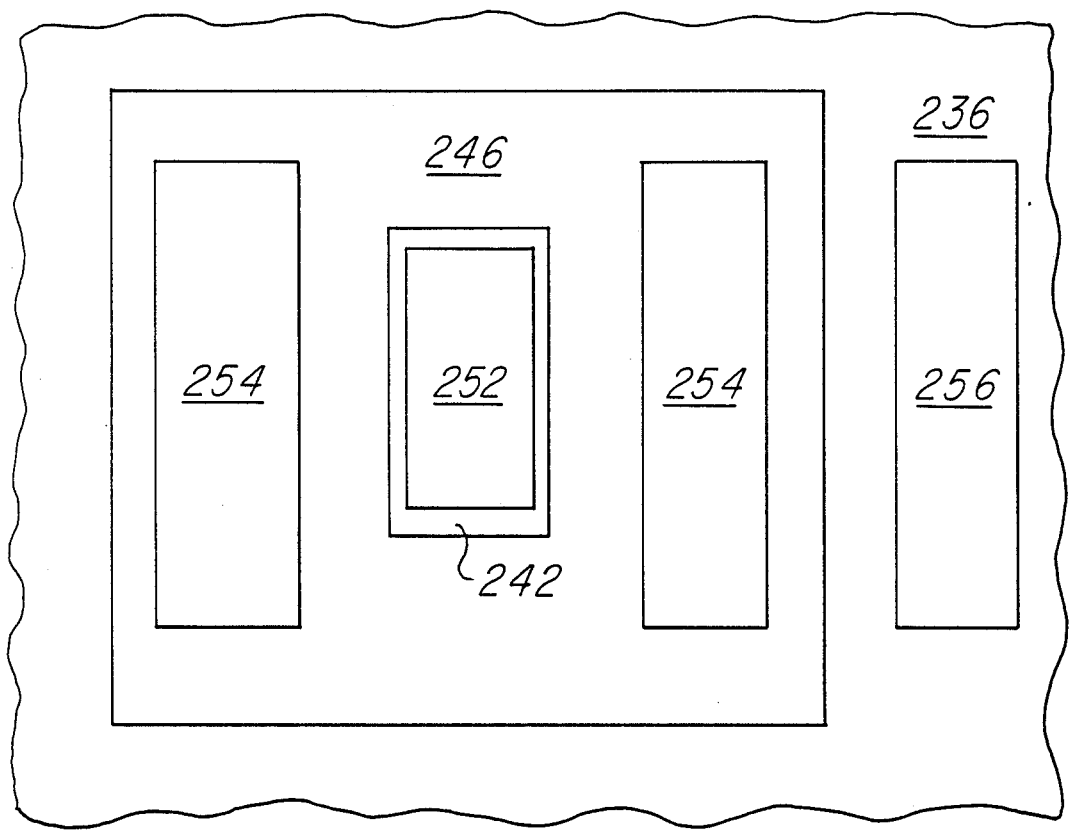

Second preferred embodiment heterojunction bipolar transistor 230, illustrated in cross sectional and plan views in FIGS. 5A–B, has an emitter-up configuration and includes semi-insulating GaAs substrate 232, n+ GaAs buried layer 234, n− GaAs collector 236, p GaAs base 238, n+ Al$_x$Ga$_{1-x}$As with x=0.5 emitter 240, n+ GaAs emitter cap 242, WSi:Zn extrinsic base 246, Au:Ge/Ni ohmic emitter contact 252, Au base contact 254, and Au:Ge/Ni ohmic collector contact 256. Further, regions 266, 268, and 270 of collector 236, base 238, and emitter 240, respectively, have been doped p+ by zinc; this is indicated by speckling in FIG. 5A. The dimensions and doping levels of the various regions is as follows: buried n+ GaAs 234 is 0.2 μm thick and doped with silicon to $1 \times 10^{18}$ carriers/cm$^3$; n− GaAs collector 236 is 0.6 μm thick and doped with silicon to $3 \times 10^{16}$ carriers/cm$^3$; p GaAs base 238 is 0.15 μm thick and doped with beryllium to $5 \times 10^{17}$ carriers/cm$^3$; n+ Al$_x$Ga$_{1-x}$As emitter 240 is 0.3 μm thick, 4 μm long, 2 μm wide, and doped with silicon to $1 \times 10^{18}$ carriers/cm$^3$; n+ GaAs emitter cap 242 is 0.05 μm thick and doped with silicon to $1 \times 10^{18}$ carriers/cm$^3$; and WSi:Zn extrinsic base 246 is 0.2 μm thick, 10 μm long, 8 μm wide, and composition based on W$_5$Si$_3$ doped with Zn. Zinc doped regions 266, 268, and 270 extend 0.1 μm from WSi:Zn 246 into the semiconductor; the region 268 provides good ohmic contact between base 238 and extrinsic base 246. Of course, transistor 230 could have a GaAs emitter or a Al$_x$Ga$_{1-x}$As collector. Also, note that n+ emitter 240 does not directly contact extrinsic base 246, but rather p+ region 270 does; thus the emitter efficiency is not disrupted by contact of the pedestal with extrinsic base 246 because the n-p junction of emitter 240 to base 238 is a heterojunction and the n-p junction of emitter 240 to region 270 is a homojunction.

Figure 6A:
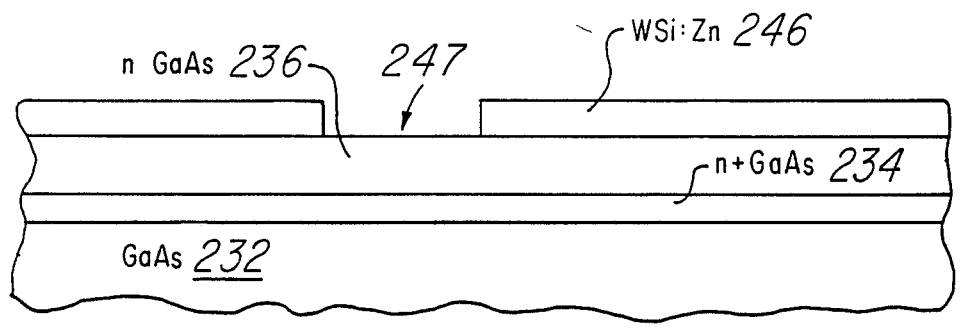
FIGS. 6A-C are cross sectional elevation views of steps in a preferred embodiment method of fabrication.
Figure 6B:
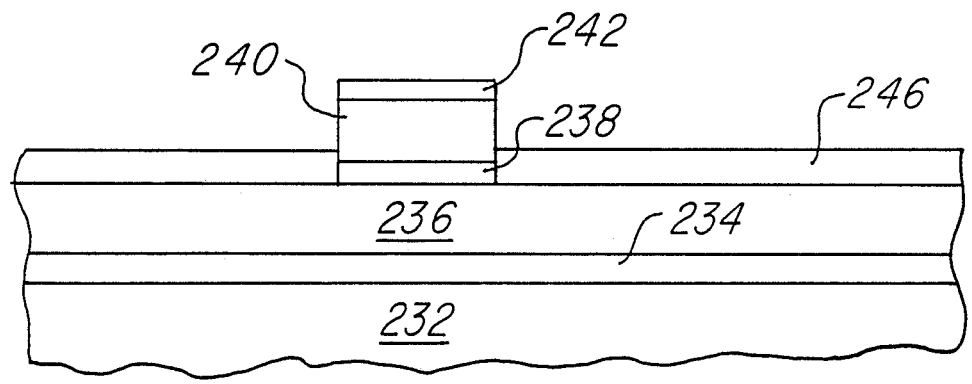
Figure 6C:
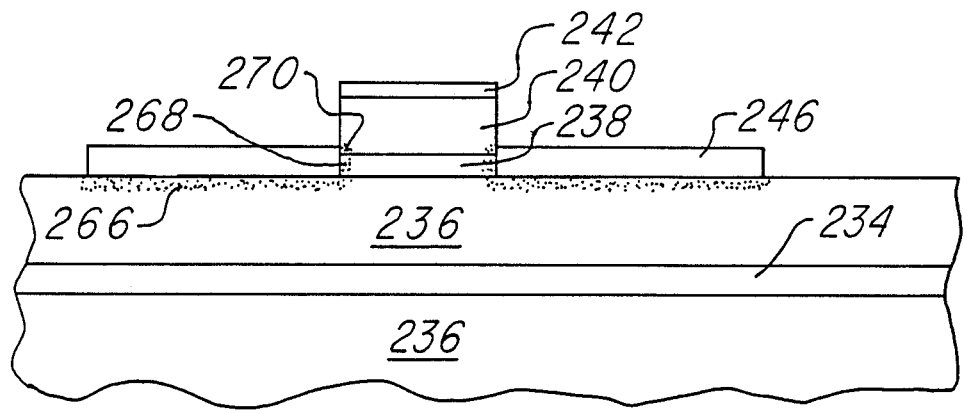

FIGS. 6A–C illustrate a second preferred embodiment method to fabricate transistor 230 and includes the following steps:

(a) Begin with a semi-insulating GaAs substrate 232 which has a 0.3 μm thick n+ GaAs epilayer 234 and a 0.8 μm thick n− second GaAs epilayer 236, and sputter deposit a 0.2 μm thick layer 246 of zinc-doped W$_5$Si$_3$. This sputtering may be from three targets (W, Si, and Zn) sequentially or simultaneously or from alloyed or compound targets, and the resulting zinc content is in the range of about 1% to 30%. Then photolithographically define with fluorine-based plasma etch a 2 μm by 4 μm window 247 in layer 246; see FIG. 6A. Fluorine-based plasmas rapidly etch W, Si, and Zn forming volatile fluorides, but do not attack GaAs.

(b) Clean the WSi:Zn-coated layered substrate and insert it into an MBE machine for growth of the following epilayers through window 247: first 0.15 μm thick p+ GaAs epilayer 238, next 0.3 μm thick n+Al$_{0.5}$Ga$_{0.5}$As epilayer 240, and lastly 0.05 μm thick n+ GaAs epilayer 242. The growth is with a substrate temperature of about 600° C. and the growth is confinced to window 247 with minimal nucleation on the WSi:Zn 246; see FIG. 6B.

(c) Photolithgraphically pattern and fluorine-based plasma etch WSi:Zn layer 246 to remove all of layer 246 except the portion to form the extrinsic base. Then anneal for twenty seconds at 800° C. to drive zinc out of extrinsic base 246 to form p+ doped regions 266, 268, and 270 in the abutting semiconductors. See FIG. 6C wherein the zinc doping is indicated by speckling.

(d) Form ohmic contacts 252, 254, and 256 by liftoff: 252 and 256 are Au:Ge/Ni alloyed and 254 is just Au on the WSi:Zn 246. This completes transistor 230.

Figure 7:
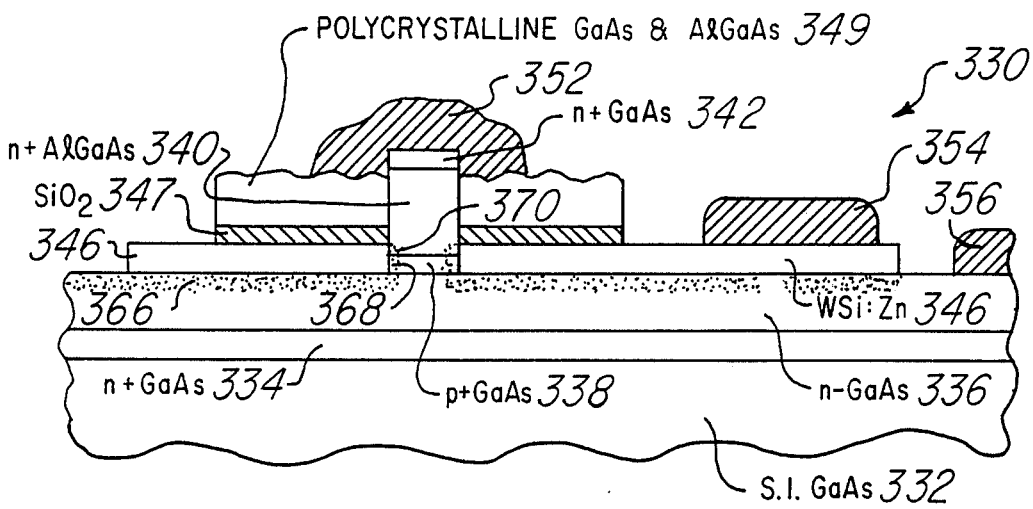
FIG. 7 is a cross sectional elevation view of a preferred embodiment bipolar transistor.

A variation of transistor 230 for emitter and base with very small area is shown in cross sectional elevation view in FIG. 7, generally denoted 330, and includes semi-insulating GaAs substrate 332, n+ GaAs buried layer 334, n− GaAs collector 336, p+ GaAs base 338, n+ Al$_x$GA$_{1-x}$As with x=0.5 emitter 340, n+ GaAs emitter cap 342, WSi:Zn extrinsic base 346, silicon dioxide layer 347, polycrystalline GaAs and Al$_x$Ga$_{1-x}$As layer 349, Au:Ge/Ni ohmic emitter contact 352, Au base contact 354, and Au:Ge/Ni ohmic collector contact 356. Further, regions 366, 368, and 370 of collector 336, base 338, and emitter 340, respectively, have been doped p+ by zinc; this is indicated by speckling in FIG. 7. The dimensions and doping levels of the various regions is as follows: buried n+ GaAs 334 is 0.3 μm thick and doped with silicon to $1 \times 10^{18}$ carriers/cm$^3$; n− GaAs collector 336 is 0.8 μm thick and doped with silicon to $5 \times 10^{16}$ carriers/cm$^3$; p+ GaAs base 338 is 0.15 μm thick and doped with beryllium to about $5 \times 10^{17}$ carriers/cm$^3$; n+ Al$_x$Ga$_{1-x}$As emitter 340 is 0.3 μm thick, 1 μm long, 0.5 μm wide, and doped with silicon to $1 \times 10^{18}$ carriers/cm$^3$; n+ GaAs emitter cap 342 is 0.05 μm thick and doped with silicon to $1 \times 10^{18}$ carriers/cm$^3$; silicon dioxide 347 is 0.1 μm thick and 3 μm square centered about emitter 340; polycrystalline GaAs and Al$_x$Ga$_{1-x}$As 349 is about 0.1 to 0.2 μm thick; and WSi:Zn extrinsic base 346 is 0.2 μm thick, 8 μm long, 6 μm wide, and compostion W$_5$Si$_3$ doped with Zn. Zinc doped regions 366, 368, and 370 can extend 0.05

μm from WSi:Zn 346 into the semiconductor; the region 368 provides good ohmic contact between base 338 and extrinsic base 346. Note that emitter ohmic contact 352 has much larger area than emitter 342, but that the overhang onto polycrystalline GaAs 349 is insulated from extrinsic base 346 by silicon dioxide 347 and the polycrystalline GaAs 349 itself. Thus the small area of emitter 342 is not a constraint on the size ohmic contact 352.

Figure 8:
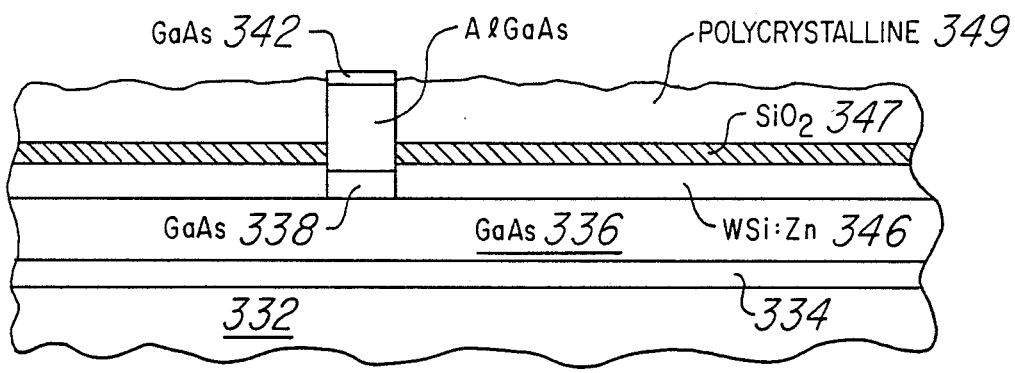
FIG. 8 illustrates deposition of polycrystalline material simultaneously with selective epitaxial growth.

Further features of transistor 330 can be understood through consideration of a third preferred embodiment method of fabrication as follows:

As in step (a) of the second preferred embodiment method, begin with a GaAs substrate with n+ and n− epilayers; sputter deposit WSi:Zn; and LPCVD silicon dioxide on the WSi:Zn. Photolithographically pattern and etch a window in the silicon dioxide and WSi:Zn. Epitaxially grow p+ GaAs and n+ $Al_xGa_{1-x}As$ from the window; concurrently, polycrystalline GaAs and $Al_xGa_{1-x}As$ will grow on the silicon dioxide. The rate of growth of the polycrystalline GaAs and $Al_xGa_{1-x}As$ is about the same as the rate of growth of the epitaxial GaAs and $Al_xGa_{1-x}As$, thus the epitaxial pedestal will be about even with the polycrystalline material. See FIG. 8. The patterning and etching steps to complete transistor 330 are similar to the steps of the second preferred embodiment method with the additional steps of patterning and etching the polycrystalline GaAs and $Al_xGa_{1-x}As$ and silicon dioxide.

Note the following features of both transistor 230 and transistor 330: (1) The base doping level and thickness are independently variable in the MBE growth; in fact, the base doping could be graded. In contrast, ion implanted bases have interrelations between base thickness and doping levels. (2) The base and collector contacts do not require any penetration of an $Al_xGa_{1-x}As$ emitter layer (either by doping or etching). (3) Collector contact (extrinsic base confinement) involves only a selective fluorine-based plasma etch of the WSi:Zn. (4) Device isolation only has to breakup the collector layers rather than also base and emitter layers; thus lattice-damaging implants or ion milled trenches need be only two-thirds as deep as the usual. (5) The emitter/base active area may be made very small because the structure is self-aligned and the emitter ohmic contact is not constrained in size (for transistor 330). Additionally, the base layer could be grown with the n− and n+ collector layers so that only emitter must be selectively deposited.

Figure 9:
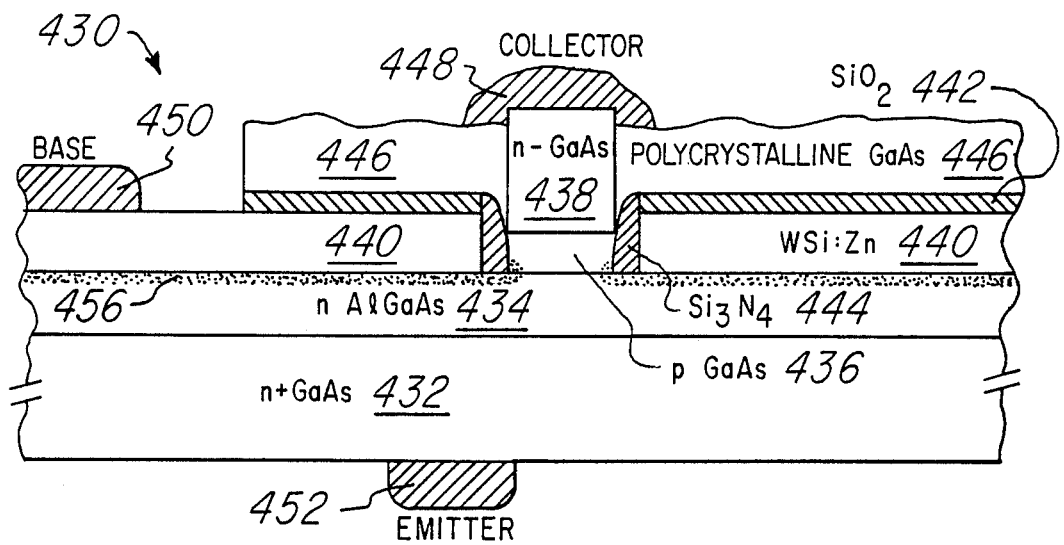
FIG. 9 is a cross sectional elevation view of a preferred embodiment bipolar transistor.

Fourth preferred embodiment emitter-down configuration heterojunction bipolar transistor 430 is illustrated in cross sectional elvation view in FIG. 9 and includes n+ $Al_xGa_{1-x}As$ substrate 432, n $Al_xGa_{1-x}As$ emitter layer 434, p GaAs base 436, n− GaAs collector 438, $W_5Si_3$:Zn extrinsic base 440, silicon dioxide insulator 442, silicon nitride sidewalls 444, polycrystalline GaAs 446, Au:Ge/Ni ohmic collector contact 448, Au ohmic base contact 450, and Au:Ge/Ni ohmic emitter contact 452. Also, p+ doped portion of layer 434 (indicated by speckling in FIG. 9) extends from extrinsic base 440 to base 436 and provides the connection between base 436 and extrinsic base 440. Transistor 430 has a self-aligned collector 438 and base 436 which may have an area smaller than the collector ohmic contact 448, and transistor 430 also shares many of the features of transistors 230 and 330 enumerated previously.

Figure 10A:
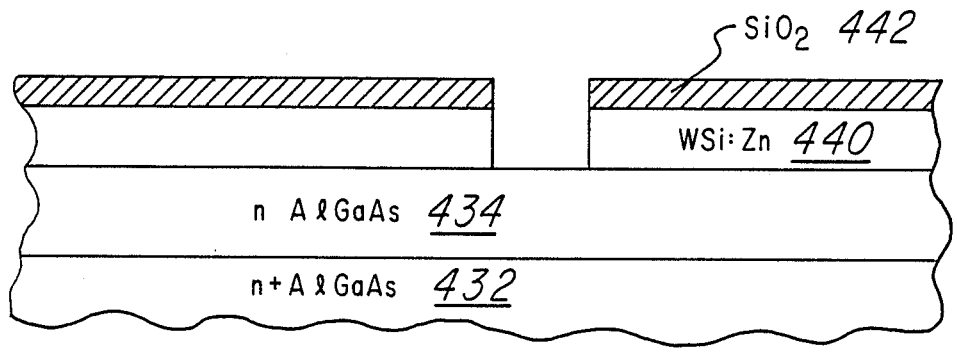
FIGS. 10A-B are cross sectional elevation views of steps in a preferred embodiment method of fabrication.

Further features of transistor 430 are best understood in connection with the following description of a fourth preferred embodiment method of fabrication:

(a) Begin with an n+ $Al_xGa_{1-x}As$ substrate 432 having a 0.3 μm thick epilayer of $Al_xGa_{1-x}As$ 434 doped n to a carrier concentration of $1 \times 10^{18}/cm^3$; and sputter deposit a 0.2 μm thick layer of $W_5Si_3$:Zn (about 10% Zn) 440. Next deposit a 0.05 μm thick layer of LPCVD silicon dioxide 442, and photolithographically pattern and plasma etch a 0.5 μm square window in layers 440 and 442. See FIG. 10A. Note that the zinc doping in WSi 440 may be concentrated at the interface with $Al_xGa_{1-x}As$ 434 to avoid any problems of zinc diffusion up into silicon dioxide 442.

Figure 10B:
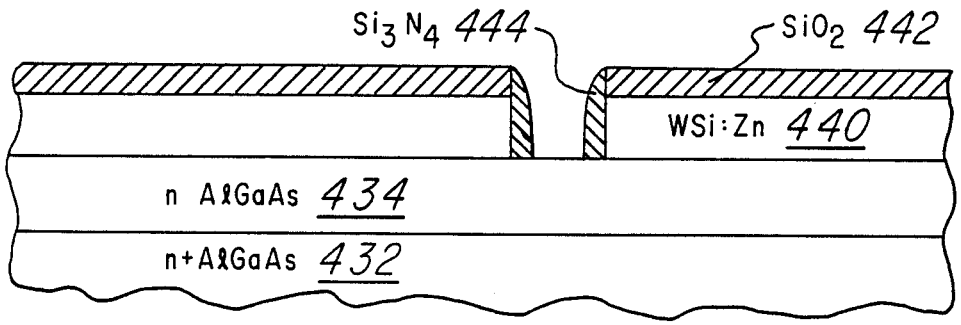

(b) Conformally deposit 0.1 μm of silicon nitride 444 by LPCVD, and anisotropically etch nitride 444 by $CH_3F$ reactive ion etching which is selective over oxide 442. This leaves nitride sidewall filaments 444; see FIG. 10B.

(c) Clean and insert the layered substrate into an MBE machine, and epitaxially grow GaAs base 436 and GaAs collector 438; concurrently, polycrystalline GaAs 446 grows on silicon dioxide 442 and nitride 444 as previously described. After the MBE growth, photolithographically pattern and plasma etch polycrystalline GaAs 446, silicon dioxide 442, and WSi:Zn 440. Next, anneal at about 800° C. for twenty seconds to diffuse zinc out of WSi:Zn 440 into $Al_xGa_{1-x}As$ 434. Note that the diffusion of zinc in $Al_xGa_{1-x}As$ 434 is greater laterally along the interface with WSi:Zn 440 and silicon nitride 444 than into layer 434, so the resultant p+ region 456 extends 0.1 μm under nitride 444 to make contact with base 436 before penetrating too deeply into layer 434; see FIG. 9. Lastly, form ohmic contacts by liftoff processes to complete transistor 430.

Figure 11:
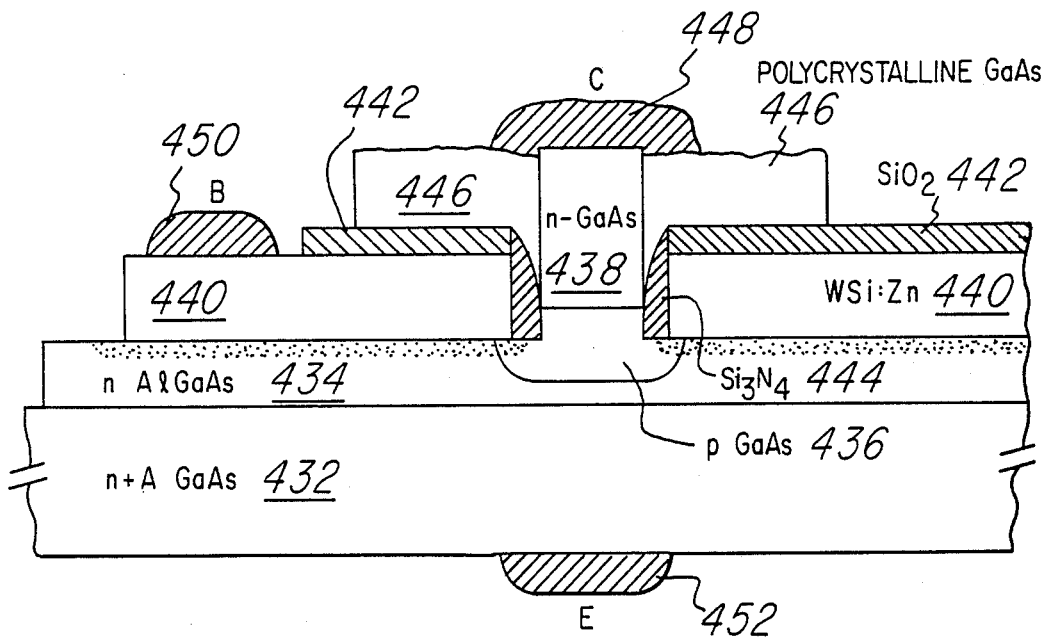
FIG. 11 is a cross sectional elevation view of a preferred embodiment bipolar transistor.
Figure 12:
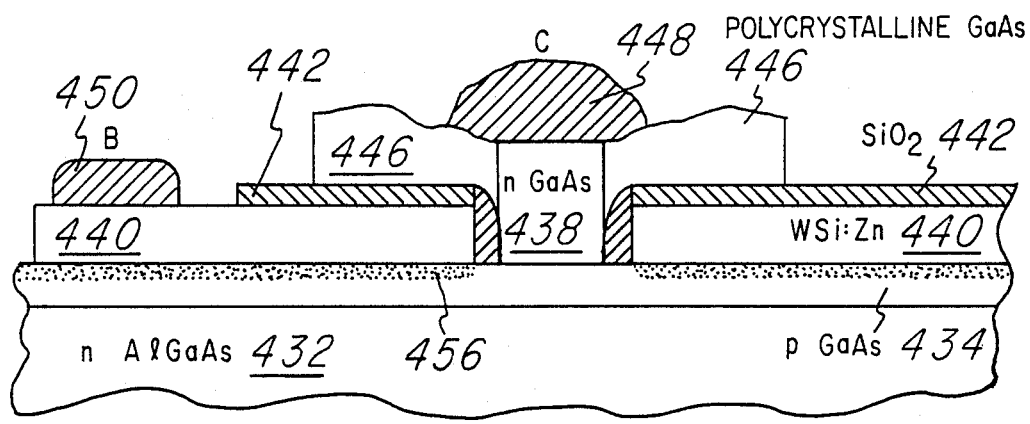
FIG. 12 is a cross sectional elevation view of a preferred embodiment bipolar transistor.

Variations of transistor 430 to improve the contact from WSi:Zn extrinsic base 440 to GaAs base 436 include isotropic overetching into $Al_xGa_{1-x}As$ layer 434 during formation of the window for the epitaxial growth of base 436 and collector 438. The overetch will permit base 436 to be grown with direct contact to WSi:Zn 440; see FIG. 11. Another variation is to make the base a GaAs epilayer on $Al_xGa_{1-x}As$ layer 434 and only grow the collector in the window; this will require isolation implants or trench etches through the base epilayer. See FIG. 12.

MODIFICATIONS AND ADVANTAGES

Various modifications of the preferred embodiment devices and methods may be made while retaining the features of selective epitaxy and its characteristic sidewalls. For example, the dimensions and shapes of the devices may be varied; the materials could be other semiconductors or systems of semiconductors such as GaP, InGaAsP, HgCdTe, Si, GaAs-on-Si, and AlGaAs-on-Si substrates or other mask materials and other dielectrics such as silicon nitride and dielectric stacks such as silicon dioxide/silicon nitride could be used is place of the silicon dioxide; the growth system could be MBE, MOCVD, chemical beam epitaxy (CBE), or atomic layer epitaxy (ALE) versions of these, or any other system that relies on surface migration of atomic species to appropriate lattice sites;

The advantages of the selective epitaxy with tungsten silicide related growth masks include (1) the ability to grow either with minimal deposition on the mask or with a surrounding polycrystalline material on the mask, (2) the mask is a conductor which can be used as part of resultant devices to make contact to the bottom portion of the grown structure, (3) the mask can be doped and act as a source of dopants for the grown-upon substrate and the bottom portion of the grown structure, and (4) the mask can have its surface characteristics adjusted by deposition of the mask as alternating layers of tungsten and silicon with the final layer determinative of surface characteristics. Further, the grown structure has vertical sidewalls and does not need microcleaving, wet etching or reactive ion etching to form laser mirrors, and may be used for self-aligned transistor structures. The base doping and thickness of the transistor structures are independent variables controlled by the epitaxial growth as opposed to the interrelation for ion implanted bases. The extrinsic base is automatically provided by the growth mask without etches or implants.

What is claimed is:

1. A semiconductor laser, comprising:
(a) a vertical semiconductor pedestal with a p-n junction across said pedestal, said pedestal characterized by epitaxial growth of semiconductor material through a window in a growth mask on a semiconductor body, and said pedestal sidewalls forming cavity mirrors; and
(b) electrodes connected to the p and n regions of said pedestal for conduction of the junction carrier population inversion current.

2. The laser of claim 1, wherein:
(a) said growth mask is made of tungsten silicide doped with zinc; and
(b) said semiconductor material is GaAs and $Al_xGa_{1-x}As$.

3. The laser of claim 1, wherein:
(a) said p-n junction includes a heterostructure of p doped $Al_xGa_{1-x}As$, GaAs, and n doped $Al_xGa_{1-x}As$.

4. The laser of claim 3, wherein:
(a) said growth mask is made of tungsten silicide doped with zinc.

5. A bipolar transistor, comprising:
(a) a vertical semiconductor pedestal characterized by epitaxial growth of semiconductor material through a window in a growth mask on a semiconductor body, said pedestal including a first active region and said body including a second active region;
(b) an extrinsic base formed from said growth mask;
(c) an electrical contact to said pedestal;
(d) an electrical contact to the semiconductor body; and
(e) an electrical contact to the extrinsic base.

6. The transistor of claim 5, wherein:
(a) said first active region is the emitter;
(b) the base is included in said pedestal and abuts said extrinsic base; and
(c) said second active region is the collector.

7. The transistor of claim 6, wherein:
(a) said emitter is $Al_xGa_{1-x}As$;
(b) said base is GaAs;
(c) said extrinsic base is zinc doped tungsten silicide; and
(d) said collector is GaAs.

8. The transistor of claim 5, wherein:
(a) said first active region is the collector;
(b) the base is included in said pedestal and abuts said extrinsic base; and
(c) said second active region is the emitter.

9. The transistor of claim 8, wherein:
(a) said emitter is $Al_xGa_{1-x}As$;
(b) said base is GaAs;
(c) said extrinsic base is zinc doped tungsten silicide; and
(d) said collector is GaAs.

10. The transistor of claim 5, wherein:
(a) said first region is the emitter;
(b) said growth mask is conductive material with insulating material on the surface in said window, said insulating material abutting said pedestal;
(c) the base is included in said pedestal and connects to said extrinsic base by a doped region in said body at said insulating material in said window; and
(d) said second active region is the collector.

11. The transistor of claim 10, wherein:
(a) said emitter is $Al_xGa_{1-x}As$;
(b) said base is GaAs;
(c) said extrinsic base is zinc doped tungsten silicide; and
(d) said collector is GaAs.

12. The transistor of claim 5, wherein:
(a) said first region is the emitter;
(b) said growth mask is conductive material with insulating material on the surface in said window, said insulating material abutting said pedestal;
(c) the base is a layer in said body on said second active region and abuts said extrinsic base; and
(d) said second active region is the collector.

13. The transistor of claim 12, wherein:
(a) said emitter is $Al_xGa_{1-x}As$;
(b) said base is GaAs;
(c) said extrinsic base is zinc doped tungsten silicide; and
(d) said collector is GaAs.

14. The transistor of claim 5, wherein:
(a) said first region is the emitter;
(b) said growth mask is conductive material with insulating material on the surface in said window, said insulating material abutting said pedestal;
(c) the base is in said pedestal and an abutting region in said body that extends under said insulating material at said window and abuts to said extrinsic base; and
(d) said second active region is the collector.

15. The transistor of claim 14, wherein:
(a) said emitter is $Al_xGa_{1-x}As$;
(b) said base is GaAs;
(c) said extrinsic base is zinc doped tungsten silicide; and
(d) said collector is GaAs.

16. The transistor of claim 5, wherein:
(a) said first region is the collector;
(b) said growth mask is conductive material with insulating material on the surface in said window, said insulating material abutting said pedestal;
(c) the base is included in said pedestal and connects to said extrinsic base by a doped region in said body at said insulating material in said window; and
(d) said second active region is the emitter;

17. The transistor of claim 16, wherein:
(a) said emitter is $Al_xGa_{1-x}As$;
(b) said base is GaAs;
(c) said extrinsic base is zinc doped tungsten silicide; and
(d) said collector is GaAs.

18. The transistor of claim 5, wherein:
(a) said first region is the collector;

(b) said growth mask is conductive material with insulating material on the surface in said window, said insulating material abutting said pedestal;
(c) the base is a layer in said body on said second active region and abuts said extrinsic base; and
(d) said second active region is the emitter;

19. The transistor of claim 11, wherein:
(a) said emitter is $Al_xGa_{1-x}As$;
(b) said base is GaAs;
(c) said extrinsic base is zinc doped tungsten silicide; and
(d) said collector is GaAs.

20. The transistor of claim 5, wherein:
(a) said first region is the collector;
(b) said growth mask is conductive material with insulating material on the surface in said window, said insulating material abutting said pedestal;
(c) the base is in said pedestal and an abutting region in said body that extends under said insulating material at said window and abuts to said extrinsic base; and
(d) said second active region is the emitter;

21. The transistor of claim 20, wherein:
(a) said emitter is $Al_xGa_{1-x}As$;
(b) said base is GaAs;
(c) said extrinsic base is zinc doped tungsten silicide; and
(d) said collector is GaAs.

* * * * *